US009200369B2

(12) United States Patent
Lee et al.

(10) Patent No.: US 9,200,369 B2
(45) Date of Patent: Dec. 1, 2015

(54) APPARATUS FOR TREATING THIN FILM AND METHOD OF TREATING THIN FILM

(75) Inventors: Jong-Chul Lee, Gyeongsan-si (KR); Sang-Hyuck Park, Osan-si (KR)

(73) Assignee: LG DISPLAY CO. LTD., Seoul (KR)

( * ) Notice: Subject to any disclaimer, the term of this patent is extended or adjusted under 35 U.S.C. 154(b) by 347 days.

(21) Appl. No.: 11/286,602

(22) Filed: Nov. 23, 2005

(65) Prior Publication Data

US 2006/0144687 A1 Jul. 6, 2006

(30) Foreign Application Priority Data

Dec. 30, 2004 (KR) .............................. 2004-0116195

(51) Int. Cl.
*C23C 16/48* (2006.01)
*C23C 16/04* (2006.01)
*C23C 16/455* (2006.01)

(52) U.S. Cl.
CPC ............. *C23C 16/483* (2013.01); *C23C 16/047* (2013.01); *C23C 16/45517* (2013.01)

(58) Field of Classification Search
CPC ................ C23C 16/483; C23C 16/047; C23C 16/45517
USPC .......................................................... 118/722
See application file for complete search history.

(56) References Cited

U.S. PATENT DOCUMENTS

| | | | |
|---|---|---|---|
| 4,778,693 A * | 10/1988 | Drozdowicz et al. | 427/584 |
| 4,801,352 A | 1/1989 | Piwczyk | |
| 5,014,646 A * | 5/1991 | Ito et al. | 118/725 |
| 5,103,102 A * | 4/1992 | Economou et al. | 250/492.2 |
| 5,385,633 A * | 1/1995 | Russell et al. | 438/708 |
| 6,159,297 A * | 12/2000 | Herchen et al. | 118/708 |
| 6,336,975 B1 | 1/2002 | Morishige et al. | |
| 6,566,169 B1 * | 5/2003 | Uziel et al. | 438/115 |
| 6,649,861 B2 * | 11/2003 | Duignan | 219/121.6 |
| 6,764,386 B2 * | 7/2004 | Uziel | 451/39 |

FOREIGN PATENT DOCUMENTS

| | | |
|---|---|---|
| JP | 2000-328247 | * 11/2000 |
| KR | 10-0381940 | 12/2000 |

OTHER PUBLICATIONS

Webster's New World Dictionary, The World Publishing Co., 1972, p. 1361.*
Webster's Ninth New Collegiate Dictionary, Merriam-Webster, 1986, p. 837.*
Office Action issued in corresponding Japanese Patent Application No. 2005101090627; mailed Jul. 4, 2008.

* cited by examiner

*Primary Examiner* — Jeffrie R Lund
(74) *Attorney, Agent, or Firm* — Brinks Gilson & Lione

(57) ABSTRACT

An apparatus and method for treating a thin film on a substrate is presented. The substrate is loaded on a fixed stage adapted to receive the substrate. An energy source is aligned through a space in a gas shield so as to face a thin film on the substrate to be repaired after the substrate is loaded. A protective insulating layer is removed by radiation from the energy source, a reaction gas is supplied to the space, and an open and/or short circuit in the thin film is repaired. The energy source and/or gas shield is moved during the repair, rather than the stage. If the energy source and gas shield are both moved, they are moved in opposite directions, either independently or dependent on each other, by first and second operating units, respectively.

6 Claims, 5 Drawing Sheets

APPARATUS FOR TREATING THIN FILM AND METHOD OF TREATING THIN FILM

The present invention claims benefit of Korean Patent Application No. P2004-0116195, filed in Korea on Dec. 30, 2004, which is hereby incorporated by reference.

TECHNICAL FIELD

The present invention relates to an apparatus for treating a thin film and a method of treating a thin film.

BACKGROUND OF THE RELATED ART

Until recently, display devices have typically used cathode-ray tubes (CRTs). Presently, much effort is being expended to study and develop various types of flat panel displays, such as liquid crystal display (LCD) devices, plasma display panels (PDPs), field emission displays, and electro-luminescence displays (ELDs), as a substitute for CRTs.

These flat panel displays have a light emitting layer or a light polarizing layer on at least one transparent substrate. Recently, an active matrix type flat panel display, where a plurality of thin film transistors (TFTs) are arranged in a matrix manner, has become widely used due to high resolution and high ability of displaying moving images.

The flat panel display includes multiple thin films. Accordingly, the flat panel display is fabricated through the repetition of a thin film-depositing process, a photolithography process and a thin film-etching process. Also, when a thin film pattern formed through such processes has defects such as an open circuit or a short circuit, a process for repairing the defects of the thin film pattern is conducted.

A thin film-treating process such as a depositing process, an etching process and a repairing process is conducted in a vacuum chamber for thin film-treating. The vacuum chamber has a vacuum condition area. However, large sized substrates are problematic for the vacuum chamber. In other words, as a size of the flat panel display recently has increased, a size of the chamber also increases in accordance to a size of the substrate. Accordingly, the space occupied by the vacuum chamber increases. Further, a large sized vacuum chamber is advantageous for treating a large area of a substrate but is disadvantageous for treating a small area of a substrate such as repairing a part of a substrate having defects.

To solve these problems, instead of the vacuum chamber requiring a large-sized vacuum condition area, a gas shield type thin film-treating apparatus for treating a part of a substrate having defects such as a short circuit or an open circuit has been suggested.

FIG. 1 is a cross-sectional view of a gas shield type thin film-treating apparatus according to the related art.

As shown in FIG. 1, a gas shield type thin film-treating apparatus uses laser-induced chemical vapor deposition. In other words, thin film treatment is conducted by photolysis using light to irradiate a part of a substrate 2 and a reaction gas supplied to the irradiated part of the substrate 2 under atmospheric pressure.

The gas shield type apparatus includes a stage 10 where the substrate 2 is placed, a gas shield 30 over the stage 10, and an energy source 50 over the gas shield 30.

The stage 10 moves up/down and left/right i.e., horizontally and vertically, by using an operating unit (not shown). The gas shield 30 has a retention space 32, which is open up and down, disposed at a center portion of the gas shield 30 corresponding to the energy source 50. The upper open portion of the retention space 32 is shielded by a transparent window 34. A laser beam "L" irradiates a part of the substrate 2 through the transparent window 34 and the retention space 32. A reaction gas supplied to the retention space 32 flows into the substrate 2. A plurality of exhaust grooves 38 are disposed at a rear surface of the gas shield 30 facing the substrate 2 to exhaust the residual reaction gas on the substrate 2. A gas exhaust path 40 is connected to the exhaust grooves 38 to exhaust the residual reaction gas outside. A gas supply path 36 is connected to the retention space 32 to supply the reaction gas. Both the energy source 50 and the gas shield 30 are fixed, and the laser beam "L" of the energy source is focused on a part of the substrate 2.

The substrate 2 is placed on the stage 10, and the stage 10 moves to align the energy source 50 and the gas shield 30 with the substrate 2. Then, the laser beam "L" from the energy source 50 is focused on the part of the substrate 2, and the reaction gas is supplied to the retention space 32 and flows into a surface of the substrate 2. The reaction gas is activated by the laser beam "L" at the focused part of the substrate 2, and thus a thin film pattern having a dot shape is formed. Then, the stage 10 moves with the energy source 50 and the gas shield 30 fixed. Accordingly, a repair line as a thin film pattern having a line shape is formed by continuing to form the dot-shape thin film pattern. Therefore, an open-circuited line pattern is repaired with the repair line. With the gas shield type apparatus, a zapping process, if necessary, is conducted prior to repairing the open-circuited line. In other words, density and intensity of the laser beam "L" are adjusted adequately and the laser beam "L" irradiates the substrate 2 without the reaction gas, and thus an insulating layer on the open-circuited line pattern is removed to expose the open-circuited portion of the line pattern. In a similar manner, a short-circuited line pattern is separated.

In the related art gas shield type apparatus, enough reaction gas is supplied to the focused part of the substrate 2 to conduct thin film treatment. However, since thin film treatment is conducted under atmospheric pressure, a large amount of reaction gas is wasted. Also, since the stage 10 moves to conduct thin film treatment, a sufficient amount of the reaction gas is sometimes not supplied to the focused part of the substrate 2.

FIG. 2 is a cross-sectional view illustrating a flow of a reaction gas on a substrate in the related art gas shield type thin film-treating apparatus.

As shown in FIG. 2, the reaction gas supplied to the substrate 2 through the retention space 32 flows, which is shown as a flowing line "G", according to moving of the stage 10. In other words, friction between the reaction gas and the substrate 2 is generated due to moving of the substrate 2 to the right. Also, the exhaust grooves 38 exhausting the reaction gas move relative to the substrate 2. Accordingly, the reaction gas flows with the moving direction of the substrate 2 and is wasted. Therefore, sufficient reaction gas is not supplied to the focused part (focal point) "F" of the substrate 2 irradiated by the laser beam "L".

Further, when a moving speed of the stage 10 increases, a flow of the reaction gas further increases. Accordingly, the reaction gas does not remain and flows away from the focused part "F" of the substrate 2. Therefore, reliability of thin film treatment is reduced.

As a result, a moving speed of the stage 10 is limited for thin film treatment, and thus productivity and efficiency of the apparatus are reduced.

Further, since the stage moves, the space occupied by the gas shield type apparatus increases as a size of the flat panel display recently has increased. Also, a heavy burden is imposed on the operating unit to move the large-sized stage 10.

SUMMARY

By way of introduction only, an apparatus for treating a thin film on a substrate includes a stage adapted to receive the substrate; a gas shield facing the stage and having a space; an energy source disposed to face the stage through the space; a first operating unit operative to move the gas shield; and a second operating unit operative to move the energy source.

In another aspect, a method of treating a thin film on a substrate includes loading the substrate on a stage; moving the energy source to align the energy source with a part of the substrate to be treated through a space of a gas shield; and irradiating the part of the substrate with radiation from the energy source through the space of the gas shield while moving the energy source to treat the thin film.

In another aspect, a method of manufacturing a substrate includes: loading the substrate, on which a thin film is formed, on a stage; moving an energy source and a gas shield such that the energy source faces a part of the substrate to be treated through a space of a gas shield; and repairing an open circuit and/or a short circuit in the thin film by irradiating the thin film with radiation from the energy source through the space of the gas shield while moving the energy source.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiments of the present invention, which are illustrated in the accompanying drawings.

Figure 1:
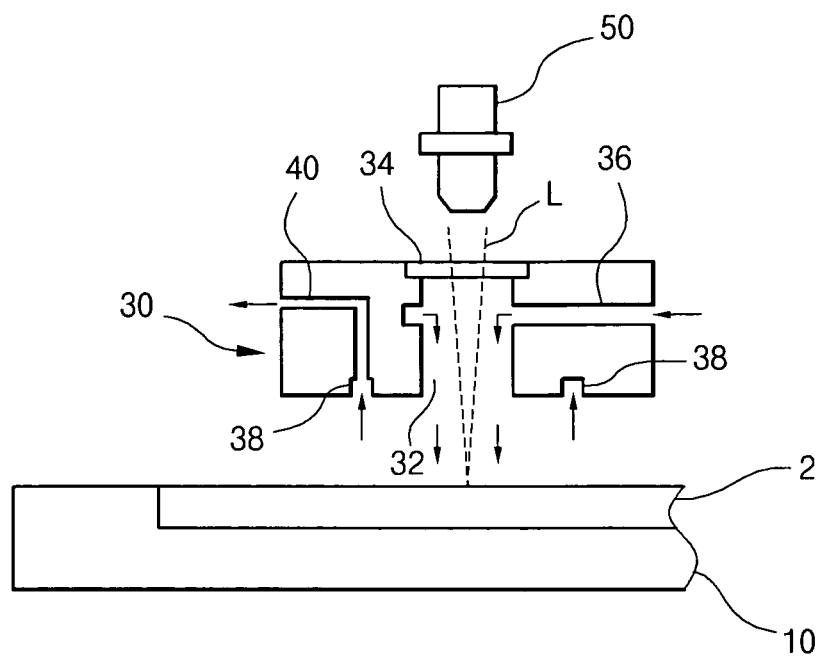
FIG. 1 is a cross-sectional view of a gas shield type thin film-treating apparatus according to the related art.
Figure 2:
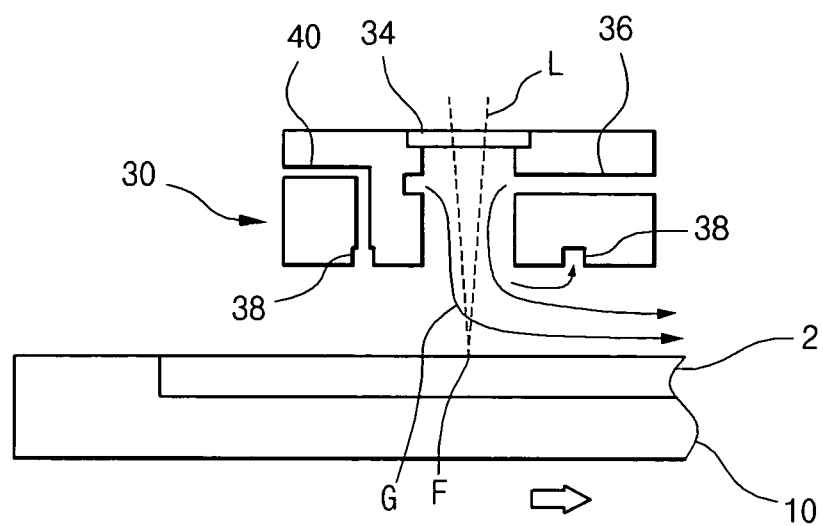
FIG. 2 is a cross-sectional view illustrating a flow of a reaction gas on a substrate in the related art gas shield type thin film-treating apparatus.
Figure 3:
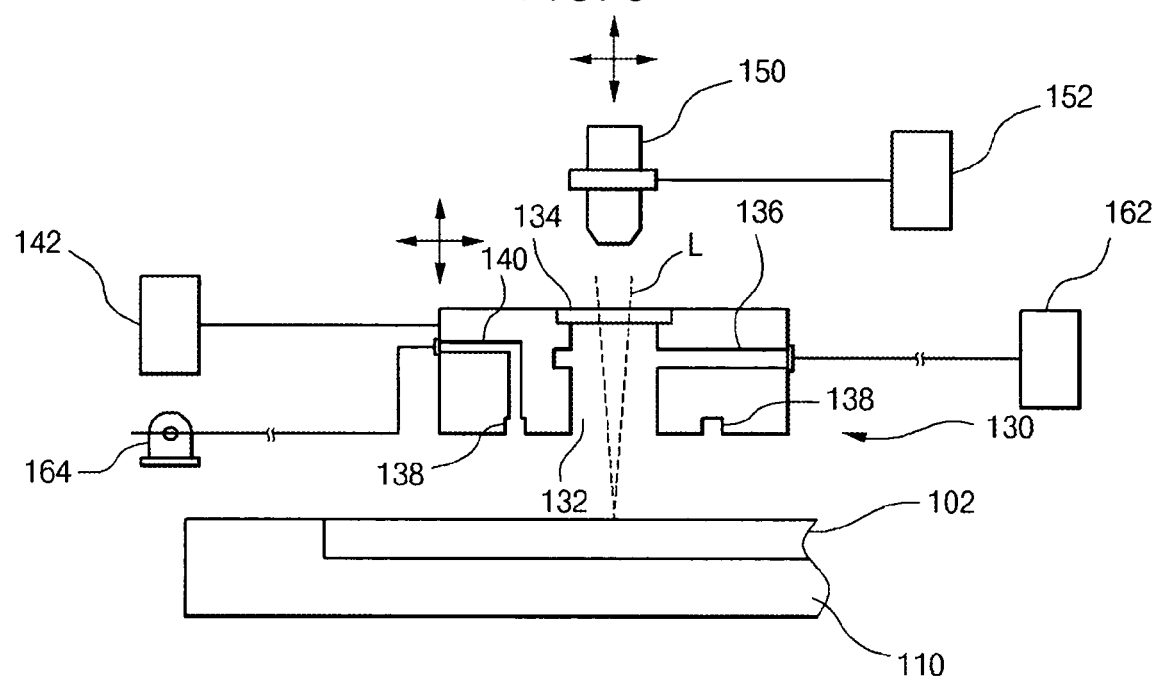
FIG. 3 is a cross-sectional view of a gas shield type thin film-treating apparatus according to a first embodiment of the present invention.

FIG. 3 is a cross-sectional view of a gas shield type thin film-treating apparatus according to a first embodiment of the present invention. The thin film-treating apparatus according to the embodiment of the present invention is applicable not only to flat panel displays but also to devices including thin films such as semiconductor devices. The process of treating a thin film includes processes related to forming a thin film on a substrate such as depositing, etching, repairing and the like.

As shown in FIG. 3, the thin film-treating apparatus includes a stage 110 where a substrate 102 is placed, a gas shield 130 disposed over and facing the substrate 102, and an energy source 150 over the gas shield 130. The thin film-treating apparatus further includes first and second operating units 142, 152 to move the gas shield 130 and the energy source 150, respectively, up/down and left/right, i.e., horizontally and vertically, with respect to the substrate 102. Accordingly, the gas shield 130 may move separately from the energy source 150.

The stage 110 may remain fixed, and the stage 110 may have a heater therein (not shown) to heat the substrate 102. The gas shield 130 is spaced apart from the substrate 102 by several micrometers to several hundred micrometers. The gas shield 130 may be made of aluminum (Al) and have a circle-banded shape or a polygon-banded shape. A retention space 132 is disposed at a center portion of the gas shield 130. The retention space 132 may have a width of about 2 mm to 5 mm. The retention space 132 is open up and down, and upper open portion of the retention space 132 is shielded by a transparent window 134. The transparent window 134 may be made of quartz. A plurality of exhaust grooves 138 is disposed in a rear surface of the gas shield 130.

The gas shield 130 has supply members to supply a reaction gas and exhaust members to exhaust the residual reaction gas. In other words, to supply the reaction gas, a gas supply path 136 is formed in the gas shield 130, and the gas supply path 136 connects a gas supply system 162 and a retention space 132. To exhaust the residual reaction gas, a gas exhaust path 140 is formed in the gas shield 130, a plurality of exhaust grooves 138 is formed on a rear surface facing the substrate 102, and the gas exhaust path 140 connects the exhaust grooves 138 and a gas exhaust system 164. The gas supply system 162 may use an Upstream Pressure Control (UPC) structure including a Mass Flow Controller (MFC), and the gas exhaust system 164 may use a vacuum pump. Accordingly, the reaction gas can be effectively supplied and exhausted by using the supply members and the exhaust members.

A laser beam "L" emitted from the energy source 150 irradiates a part of the substrate 102 through the retention space 132. The retention space 132 provides the majority of the reaction gas therein to the focused part of the substrate 102. The transparent window 134 prevents the reaction gas, which is generally poisonous, from leaking outside.

As the transparent window 134, a non-reflective plane lens may be used. In other words, when the energy source 150 moves separately from the gas shield 130, distortion of a focal point of the laser beam "L" can be prevented due to the transparent window 134 using the non-reflective plane lens.

The laser beam "L" is focused on the part of the substrate 102 through the transparent window 134 and the retention space 132. The energy source 150 may emit ultraviolet (UV) radiation, radio frequency (RF) radiation, or u-wave radiation rather than, or in addition to, the laser beam "L".

In the above-explained first embodiment, the gas shield 130 and the energy source 150 are separately moved by the first and second operating units 142, 152. In other words, the gas shield 130 and the energy source 150 move independently from each other. Meanwhile, one of the gas shield 130 and the energy source 150 may move dependent on the other. Such the dependency of the movement between the gas shield 130 and the energy source 150 is explained with reference to a second embodiment of the present invention.

Figure 4:
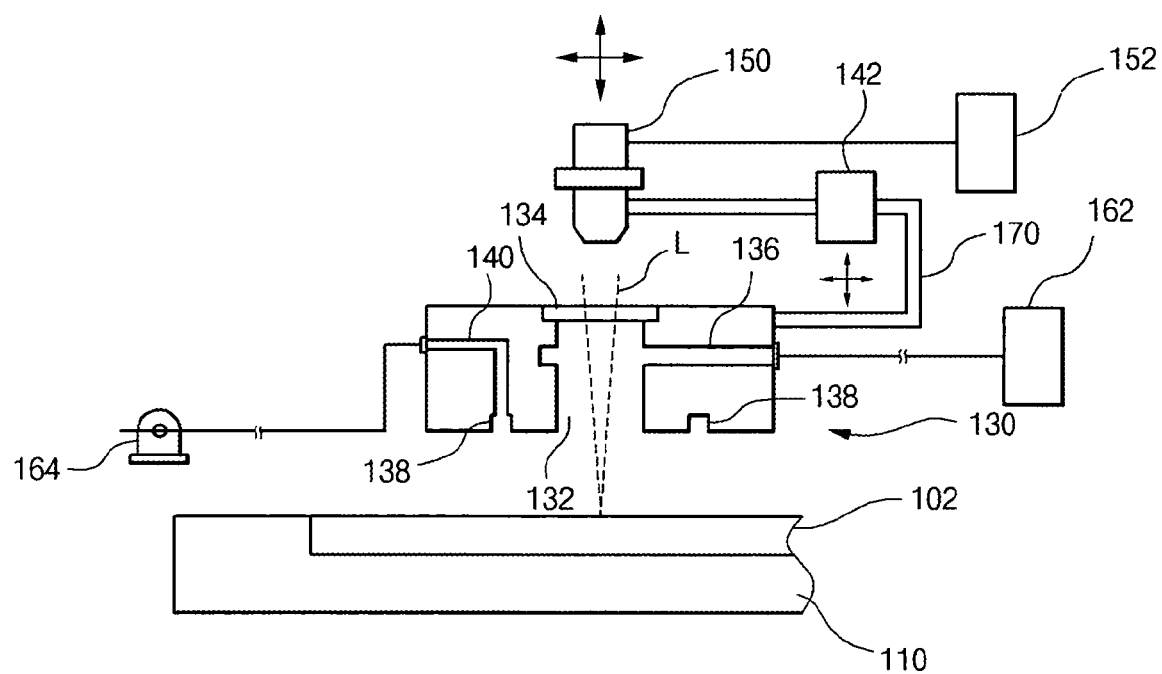
FIG. 4 is a cross-sectional view of a gas shield type thin film-treating apparatus according to a second embodiment of the present invention.

FIG. 4 is a cross-sectional view of a gas shield type thin film-treating apparatus according to a second embodiment of the present invention. The apparatus of the second embodiment is similar to the apparatus of the first embodiment, except for dependency structures of the movement between the gas shield and the energy source. Accordingly, detailed explanation of the similar parts to the first embodiment will be omitted.

As shown in FIG. 4, the gas shield 130 and the energy source 150 are connected through a connection frame 170. A first operating unit 142 is connected to the connection frame 170. Accordingly, the first operating unit 142 moves the gas shield 130 vertically and horizontally. Further, a second operating unit 152 moves not only the energy source 150 but also the connection frame 170, the first operating unit 142 and the gas shield 130 connected to the energy source 150, vertically and horizontally. Thus, movement of the gas shield 130 is dependent on movement of the energy source 150. In addition, movement of the energy source 150 may be dependent on movement of the gas shield 130, in which case the second operating unit 152 may be connected to the connection frame 170 and the first operating unit 142 may move the gas shield 130, the connection frame 170, the second operating unit 152 and the energy source 150.

Using an energy source 150 and gas shield 130 whose movements are dependent on one another may be effective when the gas shield 130 and the energy source 150 moves by a long distance beyond the retention space 132. In other words, for movement between defects of a line pattern, it may be effective that both the energy source 150 and the gas shield 130 are dependent on the second operating unit 152 to move. To the contrary, to repair a defect of the line pattern, a minute movement of the energy source 150 and the gas shield 130 may be required. In this case, the gas shield 130 may move independently from the energy source 150 by using the first operating unit 142.

The above-explained apparatus according to the embodiments of the present invention can be used to treat a thin film. In other words, a process of forming a repair line for an open-circuited line pattern can be effectively conducted with the apparatus of the embodiments of the present invention. Also, a process of separating a short-circuited line pattern by adjusting density and intensity of the laser beam without the reaction gas can be conducted. Further, before repairing the open-circuited or short-circuited line, a zapping process can be conducted in which an insulating layer covering the open-circuited or short-circuited line is removed to expose the open-circuited or short-circuited line.

Hereinafter, a method of treating a thin film by using the apparatus according to the embodiments of the present invention is explained. In particular, forming a repair line is mainly explained.

First, the substrate 102 is placed on the stage 110. On the substrate 102, a line pattern having defects, such as a short circuit or open circuit, is formed previously. When an insulating layer is formed on the line pattern, a zapping process is conducted to expose the defects of the line pattern. If the line pattern has an open-circuited portion, both ends of the open-circuited portion are exposed.

Then, both the gas shield 130 and the energy source 150 are aligned with the substrate 102 by using the first and second operating units 142 and 152. In particular, this alignment is such that the focal point of the laser beam "L" is aligned with one end of the open-circuited portion. This end of the open-circuited portion is a starting point to form a repair line.

After aligning the focal point of the laser beam "L", the reaction gas is supplied to the retention space 132, and at the same time, a laser beam "L" irradiates the end of the open-circuited portion on the substrate 102. Accordingly, photolysis of the reaction gas is generated at the focal point, and thus a thin film pattern having a dot shape is formed. During this process, the residual reaction gas is exhausted through the exhaust grooves 138.

This process continues along the one end to the other end of the open-circuited portion by moving the focal point of the laser beam "L" along one end of the open-circuited portion to the other end of the open-circuited portion. In this manner, the dot-shaped thin film patterns are continuously formed, and thus a repair line constituted by the continuous dot-shaped thin film patterns is formed.

If the second operating unit 152 is not operational, the gas shield 130 and the energy source 150 may be controlled by the first operating unit 142.

When forming the repair line, the energy source 150 and the gas shield 130 may move in various manners. A movement of the energy source 150 and the gas shield 130 is explained with reference to FIGS. 5A and 5B.

Figure 5A:
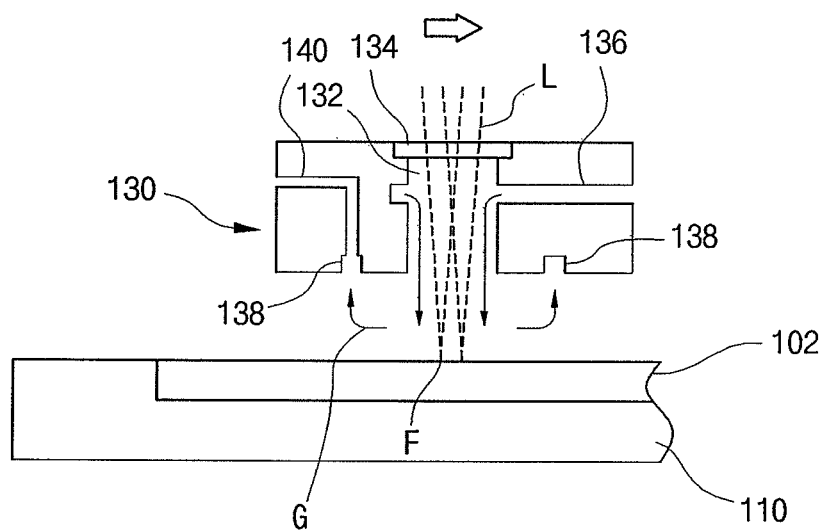
FIG. 5A is a cross-sectional view illustrating one example that the energy source only moves when forming the repair line using the gas shield type thin film-treating apparatus according to the embodiments of the present invention.
Figure 5B:
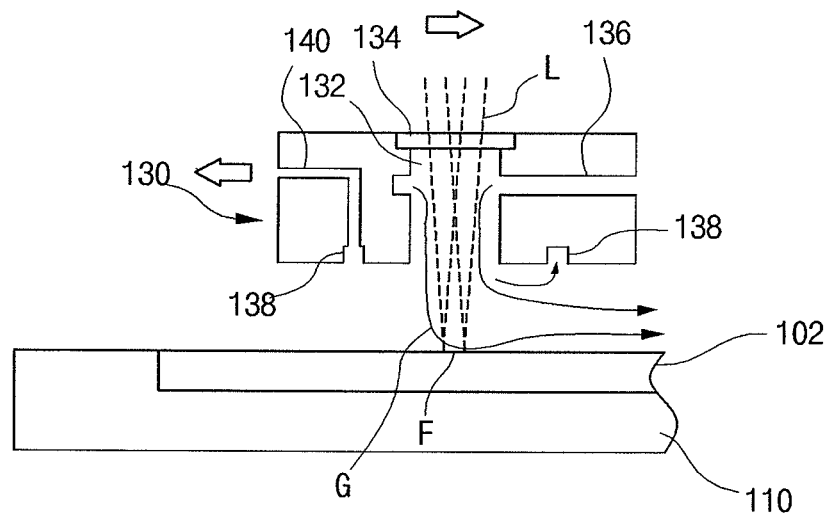
FIG. 5B is a cross-sectional view illustrating another example that the energy source and the gas shield moves opposite to each other when forming the repair line using the gas shield type thin film-treating apparatus according to the embodiments of the present invention.

FIG. 5A is a cross-sectional view illustrating one example in which only the energy source 150 moves when forming the repair line using the gas shield type thin film-treating apparatus according to the embodiments of the present invention, and FIG. 5B is a cross-sectional view illustrating another example in which the energy source 150 and the gas shield 130 move opposite to each other when forming the repair line using the gas shield type thin film-treating apparatus according to the embodiments of the present invention.

As shown in FIG. 5A, the stage 110 and the substrate 102 are fixed, and the gas shield 130 also is fixed. Accordingly, the reaction gas remains static on the substrate 102 and does not flow horizontally. Thus, a sufficient amount of reaction gas remains on the substrate 102 below the retention space 132. Further, a moving path of the energy source 150 is within the retention space 132, and thus a moving path of the focal point "F" of the laser beam "L" is within the retention space 132. Therefore, within the moving path of the focal point "F", the reaction gas is sufficiently supplied. As a result, reliability of the repair line can increase.

As shown in FIG. 5B, both the gas shield 130 and the energy source 150 move, however, the moving directions of the gas shield 130 and the energy source 150 are opposite to each other. A moving path of the energy source 150 of FIG. 5B is within the retention space 132 in a manner similar to the energy source of FIG. 5A. Accordingly, only when both ends of the open-circuited portion of the line pattern are below the retention space 132 does the gas shield 130 move opposite to the energy source 150. When the gas shield 130 moves opposite to the energy source 150, the reaction gas supplied on the substrate 102 through the retention space 132 flows, which is shown as a flowing line "G", opposite to a moving direction of the gas shield 130. In other words, the reaction gas flows according to a moving path of the focal point "F" of the laser beam "L". Therefore, within the moving path of the focal point "F", the reaction gas is sufficiently supplied. As a result, reliability of the repair line can increase.

Regardless of whether only the energy source 150 moves or both the energy source 150 and the gas shield 130 move, repair is effective when the moving path of the focal point "F" is within the retention space 132. In general, this relationship has a sufficient margin since the retention space 132 has a width of about 2 mm to 5 mm and the repair line has a length of 20 micrometers (μm) to 50 micrometers (μm).

As explained above, in the gas shield type thin film-treating apparatus according to the embodiments of the present invention, since the gas shield and the energy source move rather than the stage, the gas shield type apparatus can be applied to a large sized substrate without using a large space. Further, since a stable and sufficient amount of reaction gas is supplied to the focal point of the laser beam due to movement of only the energy source or of both the energy source and the gas shield, reliability for thin film treatment can be obtained.

Accordingly, the method of treating may correspond to a repairing process and the thin film may be formed on a large-sized substrate.

Furthermore, the operating unit according to the present invention may include a motor portion and a controlling portion. The motor portion may include a motor that can minutely control movement. The motor portion thus can include motors such as a linear motor, a stepping motor or a servomotor.

It will be apparent to those skilled in the art that various modifications and variations can be made in the apparatus for treating the thin film and the method of treating the thin film of the present invention without departing from the spirit or scope of the invention. For instance, the present invention may also be applied to other display devices. Thus, it is intended that the present invention cover the modifications and variations of this invention provided they come within the scope of the appended claims and their equivalents.

What is claimed is:

1. An apparatus for treating a thin film on a substrate, the apparatus comprising:
   a stage adapted to receive the substrate;
   a gas shield facing the stage and having a space, the space having a width of about 2 mm to 5 mm;
   an energy source disposed to face the stage through the space and irradiating a laser beam to treat the thin film;
   a first operating unit configured to move the gas shield; and
   a second operating unit configured to move the energy source, whereby the laser beam moves according to moving the energy source, wherein the second operating unit is capable of moving the energy source and the laser beam parallel to a surface of the substrate during irradiation of the laser beam from the energy source to treat the thin film, wherein the second operating unit is configured to move the energy source and the laser beam parallel to and relative to the gas shield during the irradiation, wherein when an area of the substrate to be treated is beyond the area defined by the space both the energy source and the gas shield are moved dependently, and when an area of the substrate to be treated is within the area defined by the space the energy source and the gas shield are moved independently.

2. The apparatus according to claim 1, further comprising a connection frame connecting the energy source and the gas shield.

3. The apparatus according to claim 2, wherein one of the first and second operating units is connected to the connection frame, and the energy source and the gas shield are connected through the connection frame.

4. The apparatus according to claim 1, wherein the gas shield includes a gas supply path in the gas shield operative to supply a reaction gas to the space, and a plurality of exhaust grooves in a surface facing the stage and a gas exhaust path in the gas shield operative to exhaust residual reaction gas.

5. The apparatus according to claim 1, wherein the gas shield includes a transparent window which is located over an upper open portion of the space and through which the energy source faces the space.

6. The apparatus according to claim 5, wherein the transparent widow includes a non-reflective plane lens.

* * * * *